(12) United States Patent
Shapiro et al.

(10) Patent No.: US 12,199,636 B2
(45) Date of Patent: Jan. 14, 2025

(54) LOW GATE-COUNT AND HIGH THROUGHPUT REED-SOLOMON DECODING

(71) Applicant: SAMSUNG ELECTRONICS CO., LTD., Suwon-si (KR)

(72) Inventors: Dikla Shapiro, Suwon-si (KR); Amit Berman, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 121 days.

(21) Appl. No.: 17/983,646

(22) Filed: Nov. 9, 2022

(65) Prior Publication Data

US 2024/0154627 A1     May 9, 2024

(51) Int. Cl.
    *H03M 13/15*      (2006.01)
    *H03M 13/11*      (2006.01)

(52) U.S. Cl.
    CPC .... *H03M 13/1515* (2013.01); *H03M 13/1111* (2013.01); *H03M 13/1525* (2013.01)

(58) Field of Classification Search
    CPC .......... H03M 13/1111; H03M 13/1515; H03M 13/1525
    See application file for complete search history.

(56) References Cited

U.S. PATENT DOCUMENTS

| | | | | | |
|---|---|---|---|---|---|
| 5,583,499 | A | * | 12/1996 | Oh | H03M 13/151 341/94 |
| 5,971,607 | A | * | 10/1999 | Im | H03M 13/151 714/751 |
| 6,031,875 | A | * | 2/2000 | Im | H03M 13/151 714/784 |
| 6,041,431 | A | * | 3/2000 | Goldstein | H03M 13/29 714/756 |
| 8,296,632 | B1 | * | 10/2012 | Shokrollahi | H03M 13/1545 714/784 |
| 10,193,574 | B1 | * | 1/2019 | Teitel | H03M 13/1111 |
| 10,763,895 | B2 | * | 9/2020 | Santhanam | H03M 13/1515 |
| 2004/0078747 | A1 | * | 4/2004 | Miller | H03M 13/1585 714/784 |

* cited by examiner

*Primary Examiner* — Albert Decady
*Assistant Examiner* — Enamul M Kabir
(74) *Attorney, Agent, or Firm* — Fish & Richardson P.C.

(57) ABSTRACT

A method of operation for a Reed-Solomon decoder includes receiving partial input data of symbols of a Reed-Solomon codeword; updating Reed-Solomon syndromes and error location polynomial coefficients based on the partial input data; maintaining the Reed-Solomon syndromes and the error location polynomial coefficients in a memory prior to starting activation of Reed-Solomon decoding; and inputting the Reed-Solomon syndromes and the error location polynomial coefficients to a first activation of Reed-Solomon decoding including calculating an initial error evaluator polynomial as a first error evaluator polynomial, performing error detection based on the first error evaluator polynomial to determine presence and location of errors in an input Reed-Solomon codeword, and updating the error location polynomial when errors are found in the input Reed-Solomon codeword. The error location polynomial coefficients in the memory are updated during each activation of Reed-Solomon decoding when at least one error is identified in the Reed-Solomon codeword.

21 Claims, 12 Drawing Sheets

LOW GATE-COUNT AND HIGH THROUGHPUT REED-SOLOMON DECODING

BACKGROUND

Generalized Concatenated codes (GCC) consist of outer codes with code symbols protected by an inner code. The most frequent form of inner codes are Reed-Solomon codewords or generalized Reed-Solomon (GRS) codewords. The inner code may be a decodable linear code such as a BCH code or polar code. A GCC code layout may be visualized as including GRS codewords and frames. The GRS codewords may include underlying data, GCC parity bits and basic frame parity bits. The parity bits are protected by the Reed-Solomon codewords. The GCC code is built so that the GCC parity bits make the GRS codewords with the underlying data. In a GCC decoder, frames are decoded with a frame decoder with variable amounts of parity bits.

GRS codewords are used in many error correction applications. A GRS codeword includes multiple frames, each frame includes multiple symbols, and each symbol includes multiple bits. Encoded GRS codewords may be transmitted through channels that introduce two types of noise, i.e., erasures E0 and errors E1. A transmitted GRS codeword C may be transmitted without noise, whereas the received GRS codeword R may be received with noise including the erasures E0 and the errors E1. Some ECC (error correction code) schemes use GRS codewords to correct both erasures E0 and errors E1.

A typical decoder flow consists of first constructing an initial erasure locator polynomial ELP0 for the GRS codeword, which contains information of numbers of and locations of erasures E0 in the GRS codeword, and calculating the syndrome $S(x)$ of the GRS codeword, which contains information of numbers of and locations of errors E1 in the GRS codeword. At this stage, the numbers and locations of erasures are already known from the initial ELP0, and the degree of the initial ELP0 equals the number of erasures E0. However, the number of and locations of errors E1 in the GRS codeword are not yet known at this stage. Second, the initial ELP0 is updated to an auxiliary ELP by applying the Berlekamp-Massey (BM) algorithm to the initial ELP0 and the syndrome $S(x)$. The auxiliary ELP represents status of the decoder system and the decoding. The BM algorithm is applied repeatedly, and the degree of the auxiliary ELP throughout the processing by the BM algorithm starts at the number of erasures E0 and increases if there are errors E1. At the end of applying the BM algorithm, the degree of the auxiliary ELP equals the sum of the number of erasures E0 and the number of errors E1 in the GRS codeword, so the number of errors E1 is known after this stage. The auxiliary ELP may be referred to as the error location polynomial ELP1, and has roots representing all the known failing or non-decoded (or miss-correct decoded) frames in the codeword. Third, a Chien search (CS) algorithm is applied to the auxiliary ELP to find the locations of the errors E1 by finding zeros in the auxiliary ELP as different values for the variable x are progressively filled in to the auxiliary ELP. After the Chien search, numbers and locations of both the erasures E0 and errors E1 are known. Fourth, after the Chien search, a determination is made whether the decoding fails (which will usually occur if the codeword is still too noisy and the Singleton bound does not hold). Fifth, if the decoding does not fail, an Error and Erasure Evaluator polynomial (EEP) is updated according to ELP1. Sixth, the erasure E0 values and the error E1 values are estimated via the Forney algorithm using the EEP, the auxiliary ELP, and the known numbers and locations of both the erasures E0 and the errors E1. Processing in the conventional decoder flow is performed on a full set of frames in order for a GRS codeword, and the hardware blocks are arranged in order so as to process full sets of frames in order for each GRS codeword.

A variety of inefficiencies exist with the typical decoder flow described above. For example, the number of erasures E0 in GCC codes is often considerably larger than the number of errors E1. As a result, the repeated application of the BM algorithm is often inefficient because the number and locations of the erasures E0 in the codewords are already known from the initial ELP0. The final degree of the auxiliary ELP may become relatively large using the BM algorithm due to a relatively large number of erasures E0, even though the number and locations of the erasures E0 in the codeword are already known. When the number of erasures E0 is high in comparison to the number of errors E1, the result may be complexity and inefficiency that is impractically high for implementation. Finally, processing by Reed-Solomon decoders has been developed with the understanding that a full set of frames is required for each GRS codeword, and this has resulting in preventing some forms of efficient processing such as parallel or pipelined processing of GRS codewords

SUMMARY

According to an aspect of the present disclosure, a method of operation for a Reed-Solomon decoder includes receiving partial input data of symbols of a Reed-Solomon codeword; updating Reed-Solomon syndromes based on the partial input data; updating error location polynomial coefficients based on the partial input data; maintaining the Reed-Solomon syndromes and the error location polynomial coefficients in a memory prior to starting activation of Reed-Solomon decoding; and inputting the Reed-Solomon syndromes and the error location polynomial coefficients to a first activation of Reed-Solomon decoding including calculating an initial error evaluator polynomial as a first error evaluator polynomial, performing error detection based on the first error evaluator polynomial to determine presence and location of errors in an input Reed-Solomon codeword, and updating the error location polynomial when errors are found in the input Reed-Solomon codeword. The error location polynomial coefficients in the memory are updated during each activation of Reed-Solomon decoding when at least one error is identified in the Reed-Solomon codeword.

According to another aspect of the present disclosure, a decoding device for decoding Reed-Solomon codewords includes an interface, a memory and a decoding circuit. The interface receives partial input data of symbols of a Reed-Solomon codeword. The decoding circuit is configured to: update Reed-Solomon syndromes based on the partial input data; update error location polynomial coefficients based on the partial input data; maintain the Reed-Solomon syndromes and the error location polynomial coefficients in the memory prior to starting activation of Reed-Solomon decoding; and input the Reed-Solomon syndromes and the error location polynomial coefficients to a first activation of Reed-Solomon decoding including calculating an initial error evaluator polynomial as a first error evaluator polynomial, performing error detection based on the first error evaluator polynomial to determine presence and location of errors in an input Reed-Solomon codeword, and updating the error location polynomial when errors are found in the input Reed-Solomon codeword. The error location polynomial coefficients in the memory are updated during each activation of Reed-Solomon decoding when at least one error is identified in the Reed-Solomon codeword.

According to another aspect of the present disclosure, a system for Reed-Solomon decoding includes an interface and a processing circuit. The interface receives partial input data of symbols of a Reed-Solomon codeword. The processing circuit implements a process for decoding the Reed-Solomon codeword starting with the partial input data of the symbols of the Reed-Solomon codeword. The processing circuit is configured to: update Reed-Solomon syndromes based on the partial input data; update error location polynomial coefficients based on the partial input data; maintain the Reed-Solomon syndromes and the error location polynomial coefficients in a memory prior to starting activation of Reed-Solomon decoding; and input the Reed-Solomon syndromes and the error location polynomial coefficients to a first activation of Reed-Solomon decoding including calculating an initial error evaluator polynomial as a first error evaluator polynomial, performing error detection based on the first error evaluator polynomial to determine presence and location of errors in an input Reed-Solomon codeword. The error location polynomial coefficients in the memory are updated during each activation of Reed-Solomon decoding of Reed-Solomon decoding when at least one error is identified in the Reed-Solomon codeword.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
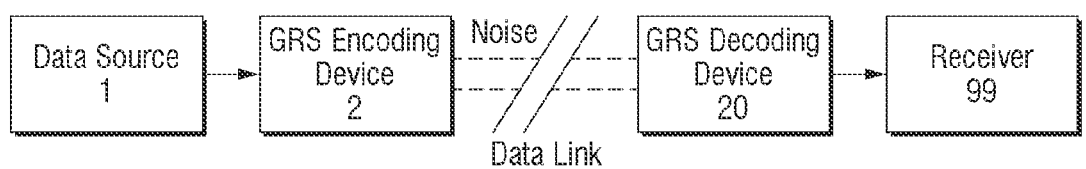
FIG. 1A illustrates a system for low gate-count and high-throughput Reed-Solomon decoding, in accordance with a representative embodiment.

In the following detailed description, for the purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the inventive concept.

The terminology used herein is for purposes of describing particular embodiments only and is not intended to be limiting. As used in the specification and appended claims, the singular forms of terms 'a,' 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims.

As described herein, low gate-count and high-throughput a Reed-Solomon decoder is provided by out-of-order input handling described herein. The teachings herein result in a reduced gate-count, and an ability to process out-of-order input. As a result, a Reed-Solomon decoder may be activated as early as possible, and with results that improve Polar decoder performance. Reed-Solomon decoding may be performed on partial data of decoded frames, with missing date treated as erasures. System status may be maintained for the error location polynomial ELP1 and the Reed-Solomon syndrome (RSS) calculated on the received input, and the inputs may be accumulated to previously received inputs. Insofar as the RSS and ELP1 are traditionally applied in the beginning of each RS code and each involve significant calculations with significant latency in GCC decode flow, the continuous maintenance of the RSS values and ELP1 values through decoding supports pipelined or parallel decode of multiple RS codewords.

FIG. 1A illustrates a system for low gate-count and high-throughput Reed-Solomon decoding, in accordance with a representative embodiment.

The system in FIG. 1A may be a distributed system in which a data source 1 and a GRS encoding device 2 are provided separate from the GRS decoding device 20 and the receiver 99.

For example, the GRS encoding device 2 may be used to communicate with the GRS decoding device 20 over a communication network such as a wide area network (WAN) or a local area network (LAN). The communication network(s) by which a data link and noise are provided may be wired and/or wireless.

Alternatively, the system in FIG. 1A may be an integrated system in which the data source 1 and the GRS encoding device 2 are provided together with the GRS decoding device 20 and the receiver 99. For example, the GRS encoding device 2 may be linked directly to the GRS decoding device 20, such as in a host/peripheral relationship in which the GRS encoding device 2 is provided by a host and the GRS decoding device 20 is provided by a peripheral such as a memory controller in a memory system. A direct link between the GRS encoding device 2 and the GRS decoding device 20 may be provided, for example, by one or more wires and/or hardware interfaces. An example of the GRS decoding device 20 provided as a peripheral memory controller in a memory system is shown in and described with respect to FIG. 1C. An example context in which the GRS decoding device 20 is provided is for a flash memory, such as in a memory controller for a flash memory system.

In the context of a flash memory, the flash memory itself may be, may include or may be included in the receiver 99, or the GRS decoding device 20 may be or may include or may be included in a decoding circuit in a memory controller for the flash memory. A flash memory that uses GRS decoding described herein may be a NAND flash memory, although the GRS decoding is not limited to flash memories let alone NAND flash memories.

Embodiments of the inventive concepts described herein are directed to the GRS decoding device 20 in the context of ECC implemented systems, and particularly in the context of GCC (generalized concatenated code) configurations. As described in the Background, a known GRS decoding device typically applies a BM algorithm to the initial ELP0 and the syndrome $S(x)$ with a polynomial of degree of the total number of erasures E0 and errors E1, and the Chien search algorithm to an auxiliary ELP $\Lambda(x)$ with a polynomial of degree of the total number of erasures E0 and errors E1. According to the teachings herein, a system ELP $\Lambda(x)$ represents status of the decoder system and the decoding, and may be updated one or more times during decoding. The GRS decoding device 20 in FIG. 1A may save time and improve throughput in decoders, by efficiently activating Reed-Solomon decoding as early as possible with partial codeword input including out-of-order input.

Figure 1B:
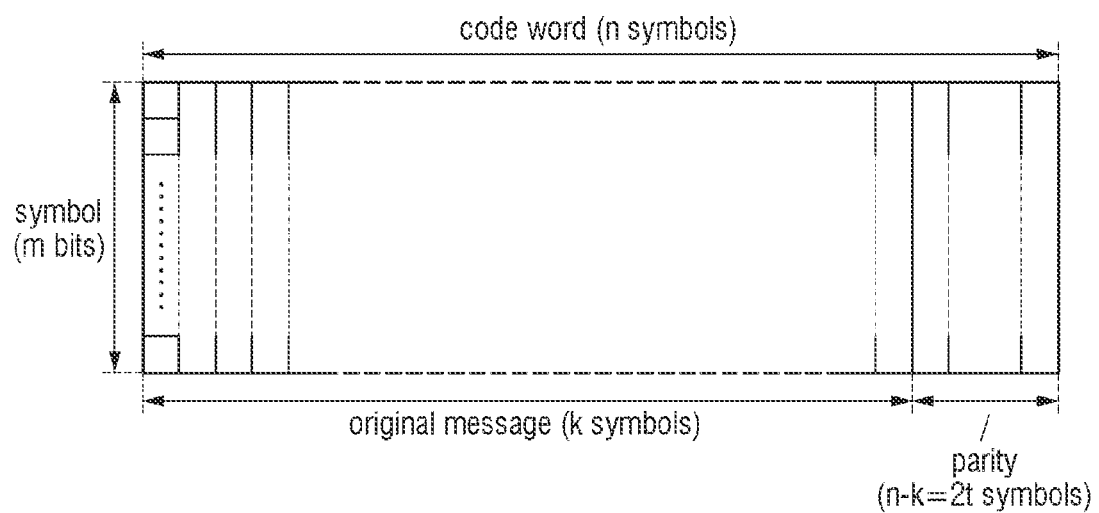
FIG. 1B illustrates an example codeword used in low gate-count and high-throughput Reed-Solomon decoding, in accordance with a representative embodiment.

FIG. 1B illustrates an example codeword used in low gate-count and high-throughput Reed-Solomon decoding, in accordance with a representative embodiment.

In FIG. 1B, a GRS codeword has n symbols, and each of the n symbols has m bits. The GRS codeword includes symbols of content of the original message encoded by a GRS encoding device 2 along with symbols of parity bits added to the symbols of the content of the original message. The n symbols of the GRS codeword include k symbols of the content of the original message and 2t symbols of the parity bits.

As used herein, the variable "C" or "c" represents a transmitted GRS codeword. The variable "R" or "r" represents a received GRS codeword. The variable "E0" represents erasures as a first form of noise. The variable "E1" represents errors as a second form of noise. The variable "N" or "n" represents the number of symbols in the codeword C or the length of the codeword C, stated as the number of symbols per codeword. The variable "M" or "m" represents the number of bits per symbol. Given these defined variables, R-C represents the noise codeword and includes both erasures E0 and errors E1.

As additional context for the teachings herein, a check matrix "H" is used to check a received codeword R. The product of multiplying the check matrix H by the received codeword R, i.e., HR, should be zero except when the received codeword R includes noise. When the received codeword R includes noise, the product of multiplying the check matrix H by the received codeword R is HR and by definition HE, since H(C+E) is equal to HC+HE and HC alone is equal to zero. Thus, the product of multiplying the check matrix H by the received codeword R (i.e., the transmitted codeword C plus noise E) equals HE. The codeword noise HE is known as the syndrome S. Syndrome is the remainder after multiplying the check matrix H by the received codeword R, and essentially reflects only the added noise.

Figure 1C:
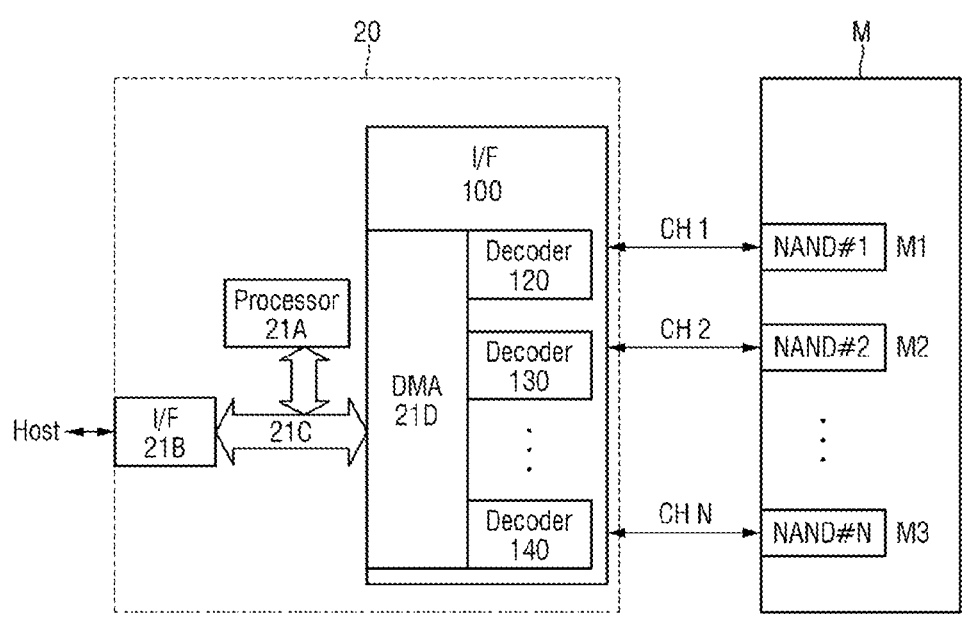
FIG. 1C illustrates a system with a memory and a decoding device for low gate-count and high-throughput Reed-Solomon decoding, in accordance with a representative embodiment.

FIG. 1C illustrates a system with a memory and a decoding device for low gate-count and high-throughput Reed-Solomon decoding, in accordance with a representative embodiment.

The system in FIG. 1C is a block diagram of a memory system such as a flash memory system. The memory system includes a GRS decoding device 20 and a memory block M. The GRS decoding device 20 may be, may be included in, or may include, for example, a memory controller. In the example of FIG. 1C, the GRS decoding device 20 includes a multi-channel error correction coder (ECC) architecture for encoding/decoding data between a host system and the memory block M. The GRS decoding device 20 includes a host interface 21B, a NAND interface 100, and a processor 21A, all connected together by a system bus 21C. The NAND interface 100 includes a DMA controller 21D (direct memory access controller) and a block of error correction coder (ECC) circuits. The block of error correction coder circuits includes a plurality (N) of ECC modules, including a first decoder 120 as decoder #1, a second decoder 130 as decoder #2, and a third decoder 140 as decoder #3. Memory block M includes a plurality (N) of NAND memory devices, including a first NAND memory M1 as memory #1, a second NAND memory M2 as memory #2, and a third NAND memory M3 as memory #3. Connected between each of the ECC modules and a corresponding one of the first NAND memory M1, the second NAND memory M2 and the third NAND memory M3 are channels CH1, CH 2 through CH 3, respectively. Of course, the number of ECC modules, the number of NAND memories and the number of channels is not limited to 3, and may instead be more or less than 3. Additionally, the ECC modules and the NAND memories are shown in FIG. 1C in a 1-1 relationship; however, an ECC module may be dedicated to more than one NAND memory without departing from the spirit of the teachings herein. Moreover, the teachings herein are not limited to NAND flash memory arrangements, or even only to flash memories. Rather, the teachings herein are applicable to GRS implementations in any of a variety of contexts.

Each of the first decoder 120, the second decoder 130 and the third decoder 140 in the multi-channel error correction coding architecture of the GRS decoding device 20 in FIG. 1C may separately include an encoder and decoder, and the decoder may include subcircuits such as error location polynomial logic, syndrome logic, and Reed-Solomon decoding logic. As the term is used in the context of hardware, "logic" refers to a processing circuit implementation for subcircuits.

In operation, data from a host device such as a computer may be destined to be stored in the memory block M. For example, data may be sent by the DMA controller 21D to the first decoder 120. In the first decoder 120, the data is first encoded by an encoder and then transmitted to the memory block M via channel 1. When data is to be read from memory block M and provided to the host device, the data is first decoded by the first decoder 120 and then the decoded data is supplied to DMA controller 21D. In the first decoder 120, a detector detects whether any errors are present in the data received from the memory block M, and if there are any errors, then a corrector corrects the errors.

Each of the first decoder 120, the second decoder 130 and the third decoder 140 may be configured to operate according to the teachings herein, and each may separately include the same or similar processing circuits. A processing circuit described herein may be or include a circuit as simple as a memory that stores instructions and a processor that executes the instructions, or a more complex circuit such as an application-specific integrated circuit (ASIC) with more than two circuit elements which may still include one or more memory/processor combinations. Examples of processors which may be used by a processing circuit include microprocessors. The decoders in FIG. 1C may each include the processing circuit of FIG. 2A.

Figure 1D:
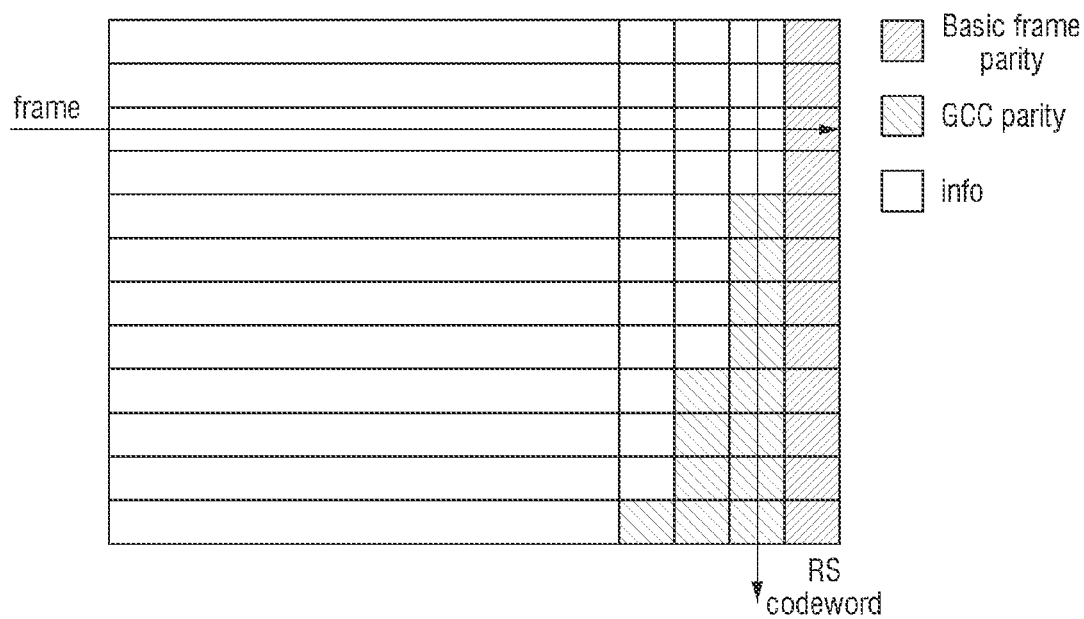
FIG. 1D illustrates a GCC code layout as context for low gate-count and high-throughput Reed-Solomon decoding, in accordance with a representative embodiment.

FIG. 1D illustrates a GCC code layout as context for low gate-count and high-throughput Reed-Solomon decoding, in accordance with a representative embodiment.

An example GCC layout is shown in FIG. 1D. The teachings herein result in a high-throughput GCC decoder. GCC codes are built in a way so that the GCC parity creates Reed-Solomon codewords with the data. A GCC decoder has frames which are decoded with a frame decoder and using variable amount of parity bits. The decoding ability correlates with the amount of parity bits available. Following decoding of frames with the basic parity, some frames may succeed and some may fail. Additional parity can be achieved by decoding the next Reed-Solomon codeword.

Figure 2A:
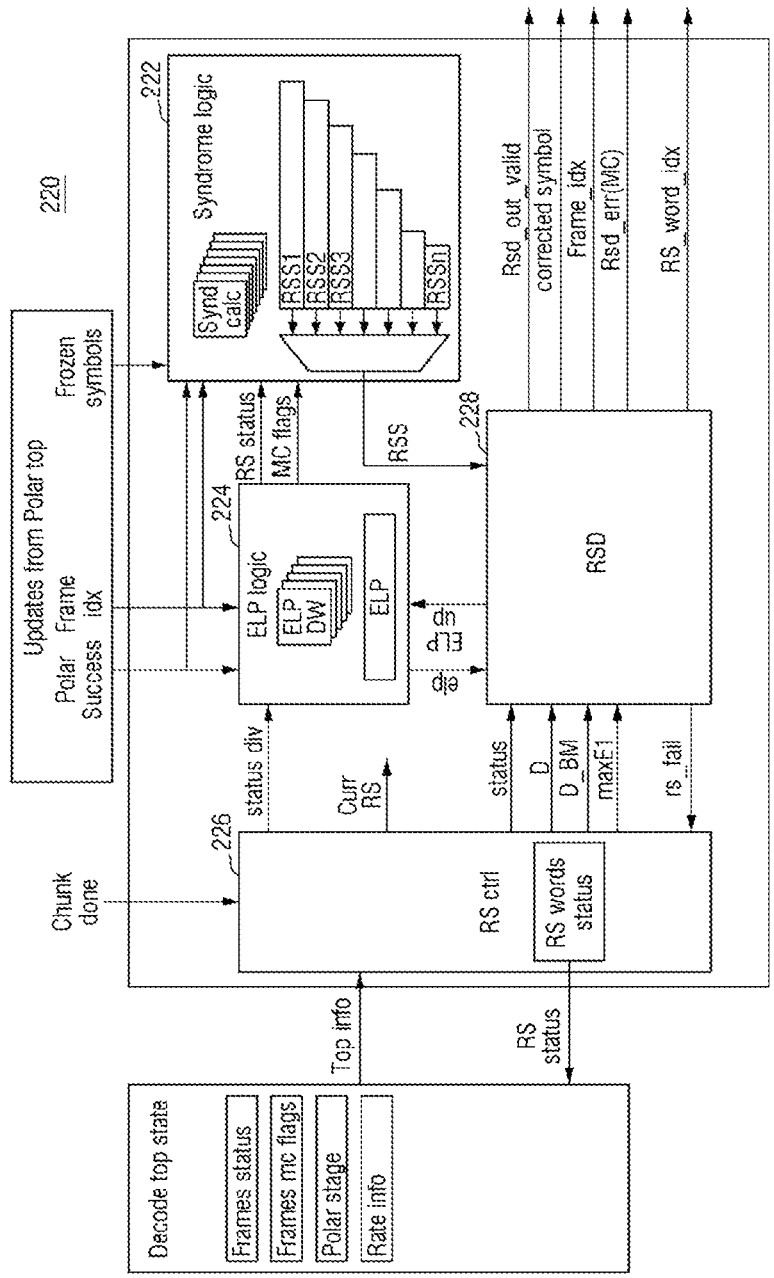
FIG. 2A illustrates a sub-system of a decoder and related logic for low gate-count and high-throughput Reed-Solomon decoding, in accordance with a representative embodiment.

FIG. 2A illustrates a sub-system of a decoder and related logic for low gate-count and high-throughput Reed-Solomon decoding, in accordance with a representative embodiment.

The sub-system and related logic in FIG. 2A may also be referred to as RS-top or Reed-Solomon top. The first decoder 220 in FIG. 2A corresponds to the first decoder 120 in one of the of the ECC modules in FIG. 1C, though each of the second decoder 130 and the third decoder 140 may be configured similar or identical to the configuration of the first decoder 220 in FIG. 2A. Decoders described herein are configured to decode Reed-Solomon codes in presence of erasures E0 and errors E1. The decoders are typically implemented by a processing circuit such as the processing circuit of the first decoder 220 in FIG. 2A.

The first decoder 220 includes syndrome logic 222, ELP logic 224 (error location polynomial logic), a RS ctrl block 226 (Reed-Solomon control block), and a RSD circuit 228 (Reed-Solomon decoder). As shown in FIG. 2A, inputs include chunks to the RS ctrl block 226, and top information to the RS ctrl block 226. Inputs also include updates from the Polar top to the ELP logic 224 including polar success updates and frame identifier updates to the ELP logic 224 and frozen symbols updates to the syndrome logic 222.

The top information to the RS ctrl block 226 may include frame status, frame mc flags, polar stage and rate information. The RS ctrl block 226 provides Reed-Solomon statuses to the top information. Updates from the Polar top include the aforementioned polar success updates and frame identifier updates and frozen symbols updates.

The syndrome logic 222 performs syndrome calculations and maintains Reed-Solomon syndromes in a memory. The syndrome logic 222 in FIG. 2A may update Reed-Solomon syndromes based on partial input data of symbols of a Reed-Solomon codeword received by the first decoder 220 as chunks. The syndrome logic 222 provides Reed-Solomon syndromes as RSS to the RSD circuit 228.

The ELP logic 224 performs error location polynomial division and maintains error location polynomial coefficients in a memory. The ELP logic 224 updates error location polynomial coefficients based on the partial input data of symbols of a Reed-Solomon codeword received by the decoder as chunks. The ELP logic also provides information of ELP to RSD circuit 228, and information of MC flags as well as the status of Reed-Solomon codewords as RS status to the syndrome logic 222.

The RS ctrl block 226 receives chunks, provides statuses of Reed-Solomon codewords to the top information, provides a trigger to start division to the ELP logic 224, and provides a trigger to start Reed-Solomon decoding to the RSD circuit 228. The RS ctrl block 226 also provides information D, D_BM and maxE1 to the RSD circuit 228. The information of maxE1 indicates the maximum number of acceptable errors in the Reed-Solomon decoding by RSD circuit 228.

The RSD circuit 228 performs Reed-Solomon decoding. The RSD provides information of failure of Reed-Solomon decoding as rs_fail to update the top information. The RSD circuit 228 also provides updated error location polynomial information as ELP up to the ELP logic 224. The output of the RSD circuit 228 includes information of whether the Reed-Solomon decoding is valid as Rsd_out_valid, corrected symbols, frame identifiers as Frame idx, Reed-Solomon errors as Rsd_err (MC) and the codeword identifier as RS_word_idx.

In order to reduce decoding time, Reed-Solomon syndrome (RSS) and error location polynomial ELP1 are calculated and maintained through decoding, and made ready to use once Reed-Solomon decoding is invoked. FIG. 2A shows a device developed to reduce decoding time in this manner.

Figure 2B:
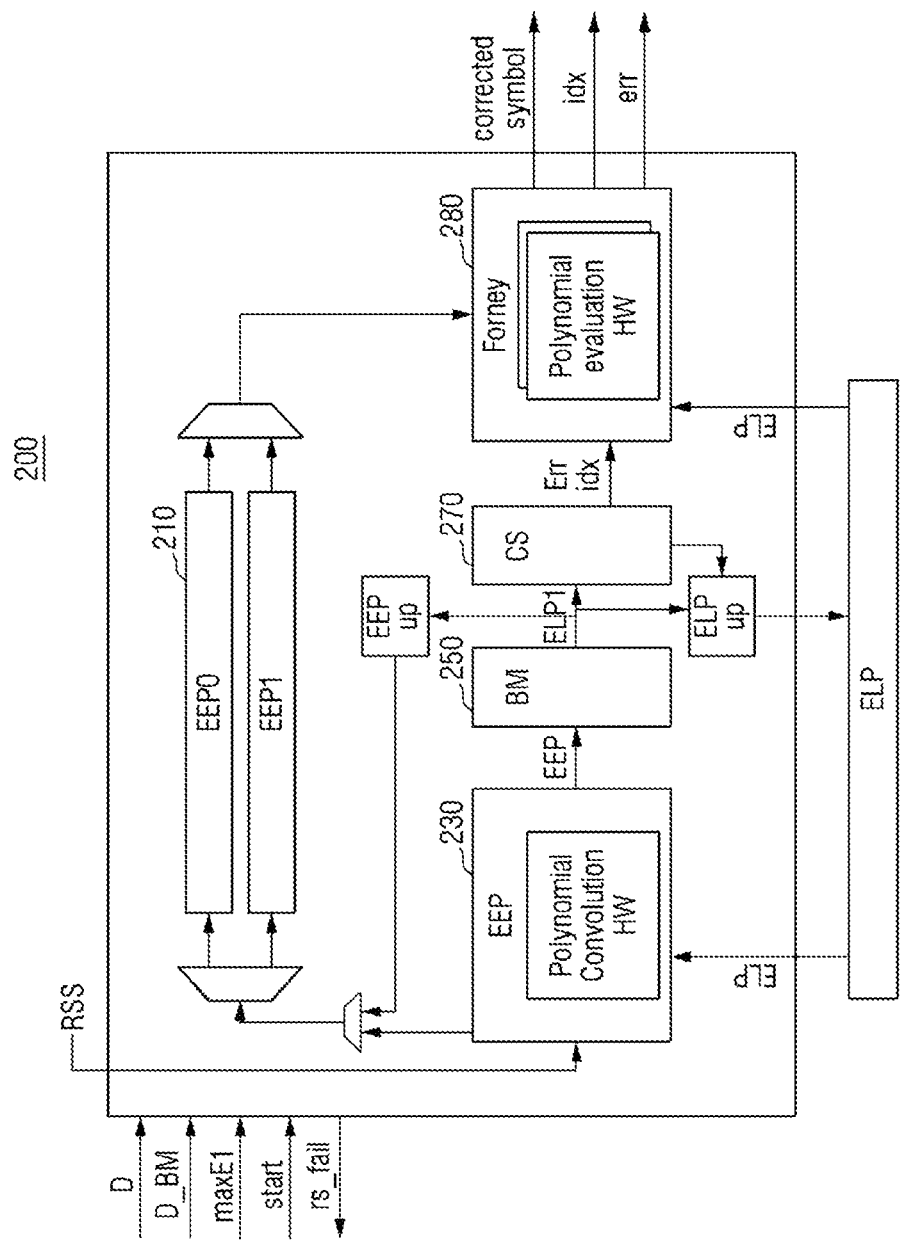
FIG. 2B illustrates a Reed-Solomon decoder for low gate-count and high-throughput Reed-Solomon decoding, in accordance with a representative embodiment.

FIG. 2B illustrates a Reed-Solomon decoder for low gate-count and high-throughput Reed-Solomon decoding, in accordance with a representative embodiment.

FIG. 2B describes a Reed-Solomon decoder in the RS-top sub system. Notably, the ELP and RSS calculations are absent from the RSD logic in the Reed-Solomon decoder in FIG. 2B, as this processing may be reduced or avoided according to the teachings herein. The Reed-Solomon decoder 200 in FIG. 2B corresponds to the RSD circuit 228 in FIG. 2A. The Reed-Solomon decoder 200 includes an error evaluator polynomial memory 210, an error evaluator polynomial subcircuit 230, a BM subcircuit 250, a CS subcircuit 270, and a Forney subcircuit 280. The Reed-Solomon decoder 200 in FIG. 2B receives a Reed-Solomon syndrome RSS as input, along with information of D, D_BM, maxE1, and the start from the RS ctrl block 226 in FIG. 2A.

Before proceeding, it should be clear that figures herein, including FIG. 1A, FIG. 1C and FIG. 2A show and reference elements that are or include circuitry with labels such as "source" "device", "receiver", "decoder", "calculator", "subcircuit", "logic" or similar terms analogous to "circuit" or "block". As is traditional in the field of the inventive concept(s) described herein, examples may be described and illustrated in terms of such labelled elements which carry out a described function or functions. These labelled elements, or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting such labelled elements may be implemented by dedicated hardware, or by a processor (e.g., one or more programmed microprocessors and associated circuitry), or by a combination of dedicated hardware to perform some functions of the labelled element and a processor to perform other functions of the labelled element. Each labelled element of the examples may be physically separated into two or more interacting and discrete circuits without departing from the scope of the present disclosure.

The error evaluator polynomial memory 210 stores error evaluator polynomials from the 230 and updates to the error evaluator polynomials from the ELP1 output by the BM subcircuit 250.

The error evaluator polynomial subcircuit 230 includes polynomial convolution hardware. The error evaluator polynomial subcircuit 230 receives the Reed-Solomon syndrome RSS and the error location polynomial ELP1, and outputs an error evaluator polynomial to the error evaluator polynomial memory 210 and to the BM subcircuit 250. The EEP is calculated by the error evaluator polynomial subcircuit 230 before the BM algorithm is applied by the BM subcircuit 250 or the Chien search is performed by the CS subcircuit 270. Additionally, the EEP is calculated based on the ELP and the RSS, and reflects the known number and locations of erasures E0. The numbers and locations of errors E1 are derivable from the RSS but not yet known after the EEP is calculated by the error evaluator polynomial subcircuit 230. For the first activation of Reed-Solomon decoding, an initial EEP is calculated as a first error evaluator polynomial. For a second activation of Reed-Solomon decoding, a second error evaluator polynomial is calculated. For a third activation of Reed-Solomon decoding, a third error evaluator polynomial is calculated. A new or updated EEP is calculated for each new activation of Reed-Solomon decoding.

The BM subcircuit 250 receives the error evaluator polynomial EEP from the error evaluator polynomial subcircuit 230 and outputs an error location polynomial ELP1 to the CS subcircuit 270 as well as to update the error evaluator polynomial memory 210. The BM subcircuit 250 constructs ELP1 by applying the BM algorithm. The ELP1 is calculated by the BM subcircuit 250 as a function of the error evaluator polynomial EEP which, in turn, is a function of the Reed-Solomon syndrome RSS received by the error evaluator polynomial subcircuit 230. The output of the BM subcircuit 250 includes ELP1. The ELP1 is the minimal polynomial with zeros related to the locations of the errors E1 in the frames received for the GRS codeword R. Each time a new or updated EEP is calculated and results in finding determining presence and location of errors in the input Reed-Solomon codeword, the error location polynomial ELP1 is updated. Coefficients of the error location polynomial ELP1 are updated by division using a matching monomial when a frame is successfully decoded.

The CS subcircuit 270 identifies the locations of errors E1 based on the ELP1 by performing a Chien search. The Chien search may also be performed conditioned on or limited to the number of tolerable errors maxE1 before the Singleton bound will not be met. For example, the Chien search may not be performed if the number of errors E1 will result in the codeword not meeting the Singleton bound. The CS subcircuit 270 outputs error identifications to the Forney 280 as Err idx.

The Forney subcircuit 280 performs conventional Forney processing based on the error identifications from the CS subcircuit 270 and the error location polynomial ELP1. The Forney subcircuit 280 includes polynomial evaluation hardware, and outputs corrected symbols, an identification idx, and errors as err. Processing in the RSD circuit 228 may begin before all frames and symbols of a Reed-Solomon codeword are received, including when frames are received out-of-order. The 210 and the error location polynomial ELP1 are provided in order to perform processing at the RSD circuit 228 even before all frames and symbols are received.

In FIG. 2B, the error location polynomial ELP1 register is shown separate from the 200. The initial erasure location polynomial ELP0 is built of the known locations or erasures. The building of the initial ELP0 polynomial is trivial: for each deletion j, (frame "j" that did not succeed to decode), multiply the ELP0 by the monomial $(1-\alpha^j x)$. In this flow, the erasure location polynomial ELP0 may be calculated early, taking the non-decoded frames as deletions. In order to avoid calculating and then re-calculating the error location polynomial ELP1 after every decoded chunk, the initial erasure location polynomial ELP0 is maintained through decoding. The erasure location polynomial ELP0 is maintained through decoding by initializing the initial value for the erasure location polynomial ELP0 with all erasure locations and before all of the frames are decoded, so missing frames are referred to as "deletions". When a frame is successfully decoded, the auxiliary ELP is divided by the matching monomial to remove from the initial ELP0. When BM processing and the Chien search are performed successfully such that errors are detected and found, the initial ELP0 is multiplied by the error location polynomial ELP1. The update is also provided to the auxiliary ELP.

Using the Reed-Solomon decoder 200 of FIG. 2, a second activation and a third activation of Reed-Solomon decoding are performed without regenerating the Reed-Solomon syndromes or regenerating error location polynomial coefficients. Instead, as noted, a new or updated error evaluator polynomial is calculated for each activation, and the auxiliary ELP is updated when errors are found. Error location polynomial coefficients in the memory to the outside of the Reed-Solomon decoder 200 are updated when at least one error is identified during an activation.

The ELP initial value is a polynomial that is a multiple of all monomials $(1-\alpha^j x)$ for $j=0, \ldots, (N-1)$ and has an initial degree of N. The initial value will be a parameter set per rate, as each rate has a different number of rows. The number of coefficient registers is derived from the maximal number of rows.

Each update to the ELP may take a few cycles. Since the RSD circuit 228 works with the ELP in all phases, only updates from Reed-Solomon decoding are allowed during Reed-Solomon decoding activity. Frame decoder updates may be accumulated in a first-in first-out (fifo) memory and updated only once Reed-Solomon decoding is not active.

As set forth above, the Reed-Solomon decoder in FIG. 2B has a flow divided into several phases. The first phase is to prepare and maintain inputs for the Reed-Solomon syndrome (RSS) and the initial erasure location polynomial ELP0 on the fly. Reed-Solomon decoding is performed and includes generating an error evaluator polynomial (EEP) and performing error detection. In some embodiments, the BM algorithm is applied and the Chien search is performed conditionally only if errors are detected. Forney processing is performed to result in the corrected codeword. The inputs to the Reed-Solomon decoding include the Reed-Solomon syndrome (RSS) and the initial erasure location polynomial ELP0, and RSS and ELP0 are maintained through the decode flow. The initial ELP0 and RSS are ready to use within several cycles after the end of each chunk of frames. Additionally, maintenance of the RSS and ELP0 is external to the RSD core, and may be physically separated using different circuit elements such as memories and microprocessors.

Figure 3A:
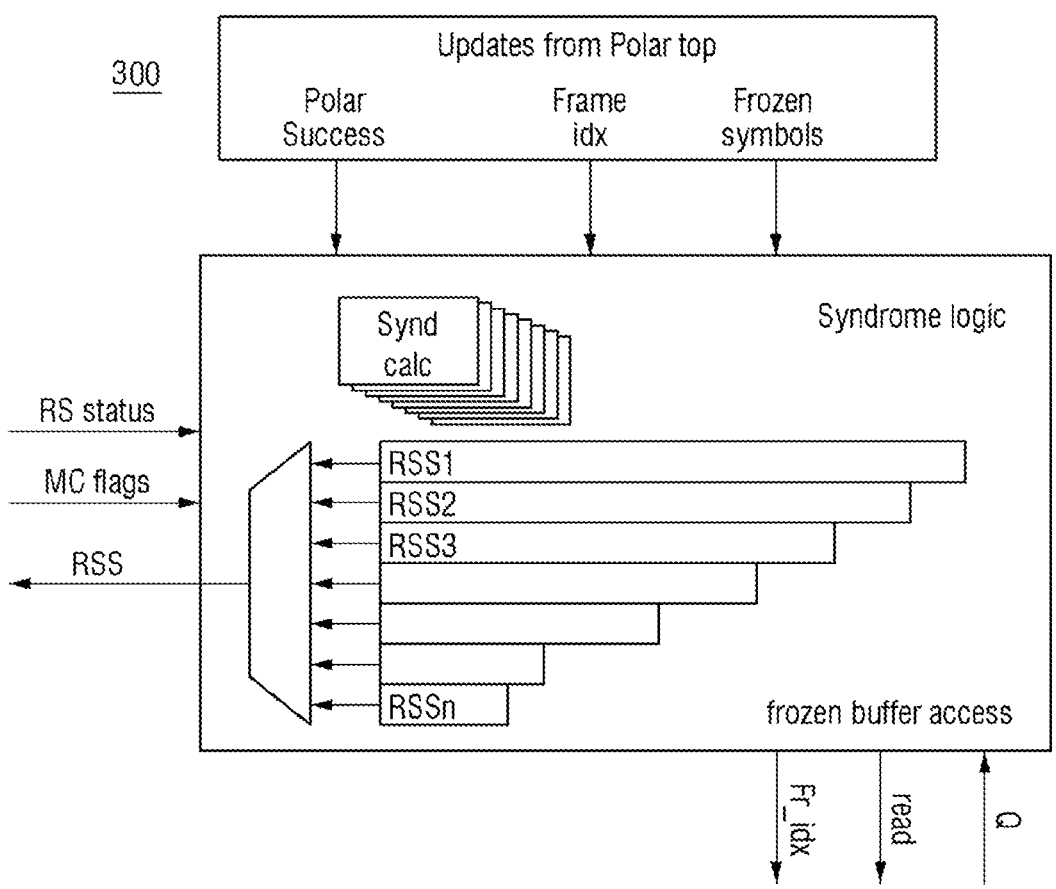
FIG. 3A illustrates syndrome logic for low gate-count and high-throughput Reed-Solomon decoding, in accordance with a representative embodiment.

The error evaluator polynomial (EEP) calculation is a polynomial convolution operation with latency resulting from the degree of the ELP degree. Hardware for the EEP calculation may be parallelized to decrease latency. In the BM algorithm processing, the syndrome Si can be derived and errors can be detected from the EEP coefficients. The BM algorithm processing and Chien search may be conditionally activated based on whether errors are detected. The BM algorithm calculates the error locations polynomial ELP1. The Chien search finds the error index(es) so that the ELP, RSS and EEP are updated accordingly. In the Forney processing, correct values for the erroneous symbols are calculated using the updated ELP and EEP. FIG. 3A illustrates syndrome logic for low gate-count and high-throughput Reed-Solomon decoding, in accordance with a representative embodiment.

The syndrome logic 300 in FIG. 3A corresponds to the syndrome logic 222 in FIG. 2A. In FIG. 3A, Polar represents the frame decoder and provides information of Polar success, frame identifications idx, and frozen symbols.

Several different hardware implementations are available for calculating syndrome. Conventionally, the Homer rule is used to calculate syndrome, and is effective when all inputs are received in order. However, as explained throughout this application, low gate-count and high-throughput Reed-Solomon decoding may be implemented before all inputs are received, and even when the received inputs are not in order. For the Homer rule, for each syndrome Si, $(i=0, \ldots, D-1)$, the syndrome value is the evaluation of the input polynomial in $\alpha i$. The input symbols may be referred to as polynomial coefficients, starting from the higher degree. The syndrome calculation for all sequential symbols of the Reed-Solomon codeword can be implemented by the "Homer rule", optionally with parallelism.

Figure 3B:
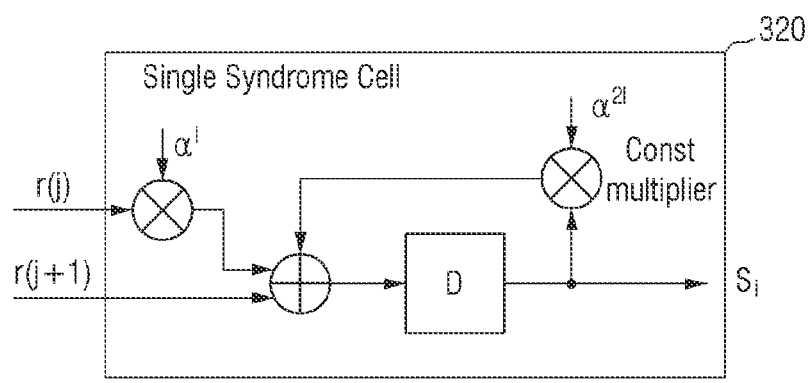
FIG. 3B illustrates conventional syndrome logic for Reed-Solomon decoding, in accordance with a representative embodiment.

FIG. 3B illustrates conventional syndrome logic for Reed-Solomon decoding, in accordance with a representative embodiment.

FIG. 3B shows hardware 320 that calculates the i-th syndrome (for all symbols) with parallelism of 2. The Homer rule syndrome calculation implemented by the syndrome logic 300 in FIG. 3A is efficient when all symbols are received in order. The conventional syndrome logic shown in FIG. 3B is efficient when all symbols are received in order.

Figure 3C:
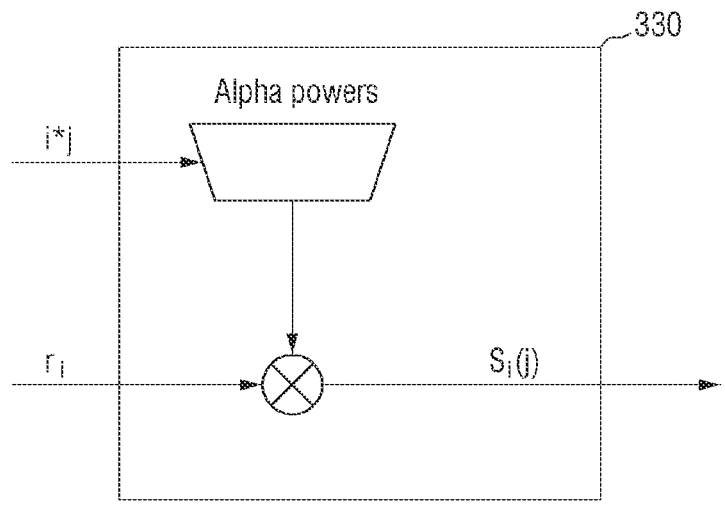
FIG. 3C illustrates syndrome logic for low gate-count and high-throughput Reed-Solomon decoding, in accordance with a representative embodiment.

FIG. 3C illustrates syndrome logic for low gate-count and high-throughput Reed-Solomon decoding, in accordance with a representative embodiment.

FIG. 3C illustrates hardware 330 as the first alternative hardware implementation for direct calculation of syndrome. Direct calculation of syndrome may use general hardware for a random update of a single syndrome Si by a single symbol in location j.

The general hardware for syndrome Si from symbol j in FIG. 3C calculates the contribution of each symbol $r_j$ to the syndrome and accumulate the contribution. For syndrome Si, the contribution of the j-th frame will be $Rj*\alpha^{ij}$.

The direct implementation in FIG. 3C may require more area since it uses a general GF multiplier, whereas the Homer implementation in FIG. 3B uses a constant-multiplier, The direct implementation may require a preliminary calculation of $i*j \mod (2m-1)$). On the other hand, the direct implementation has advantages compared to the Homer implementation. For example, when symbols arrive out of order, it is easier and faster to use the direct implementation. This may be useful when Polar MC is detected, and for the fact that rows may be decoded in a few "rounds".

As set forth below, Reed-Solomon decoding may be divided into two primary phases, activated in a pipeline. Two paths may vary based on whether input includes only erasures (deletions), or both erasures and errors.

Figure 4A:
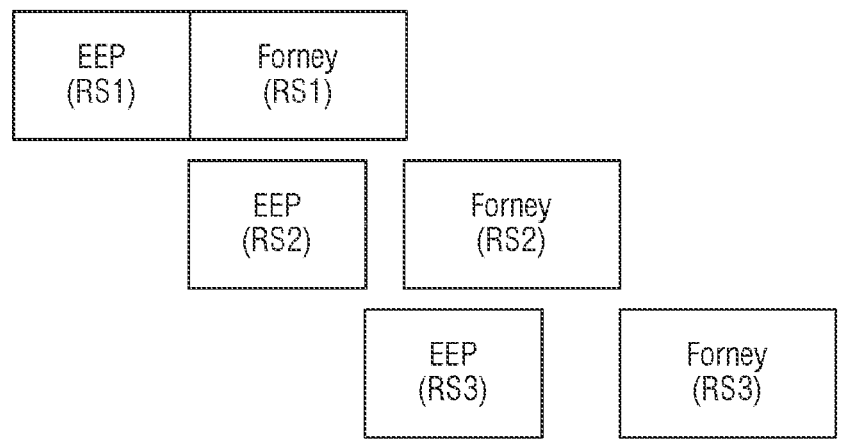
FIG. 4A illustrates Reed-Solomon flows for pipeline decoding with erasures and no errors in low gate-count and high-throughput Reed-Solomon decoding, in accordance with a representative embodiment.

FIG. 4A illustrates Reed-Solomon flows for pipeline decoding with erasures and no errors in low gate-count and high-throughput Reed-Solomon decoding, in accordance with a representative embodiment.

When input includes only erasures (deletions), several Reed-Solomon codewords may be calculated in the full pipeline shown in FIG. 4A. As shown, the EEP for the second Reed-Solomon codeword RS2 may be calculated simultaneously with the Forney for the first Reed-Solomon codeword RS1. Calculation of the EEP for the third Reed-Solomon codeword RS3 starts when calculation of the second Reed-Solomon codeword RS2 ends, and calculation of the second Reed-Solomon codeword RS2 starts when calculation of the first Reed-Solomon codeword RS1 ends. Similarly, the Forney process for the first Reed-Solomon codeword RS1, the second Reed-Solomon codeword RS2 and the third Reed-Solomon codeword RS3 is sequential.

Figure 4B:
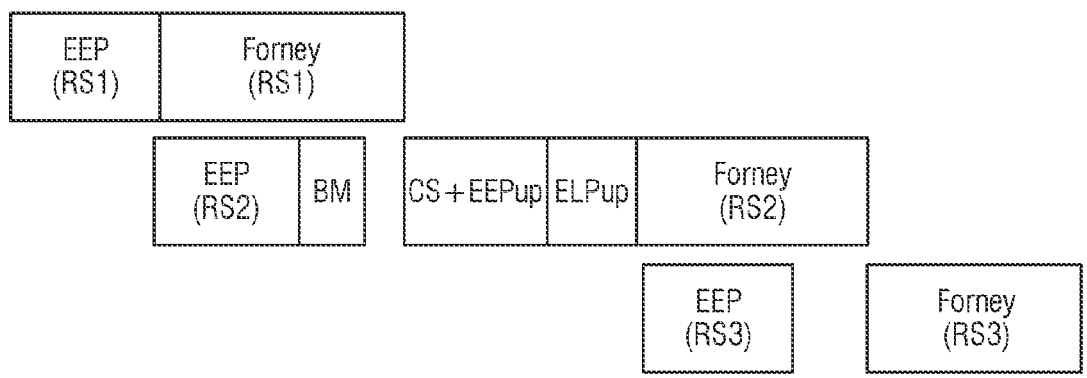
FIG. 4B illustrates Reed-Solomon flows for pipeline decoding with erasures and errors in a first RS codeword in low gate-count and high-throughput Reed-Solomon decoding, in accordance with a representative embodiment.

FIG. 4B illustrates Reed-Solomon flows for pipeline decoding with erasures and errors in a first RS codeword in low gate-count and high-throughput Reed-Solomon decoding, in accordance with a representative embodiment.

FIG. 4B illustrates the pipeline when errors are present along with erasures. As shown, when errors are detected following EEP for the second Reed-Solomon codeword RS2, BM is started, re-using the EEP convolution hardware, and this delays starting EEP for the third Reed-Solomon codeword RS3. Additionally, the Chien search for the second Reed-Solomon codeword RS2 waits for the Forney processing for the first Reed-Solomon codeword RS1 to end in this embodiment since the Chien search re-uses the Forney hardware. The EEP and ELP update will be used for the BM algorithm and the Chien search re-using the EEP convolution hardware. Processing of the third Reed-Solomon codeword RS3 may start when ELP and RSS are updated based on the second Reed-Solomon codeword RS2.

In FIG. 4B, entering the error calculation phase comprising the BM algorithm and the Chien search updates stops the pipeline, and this is for two reasons. Since the error calculation is a low probability event, the hardware of EEP and Forney is re-used. Moreover, during the error calculation phase, ELP is changed and syndrome is updated, so the next Reed-Solomon codeword is processed with the updated RSS/ELP.

Figure 5:
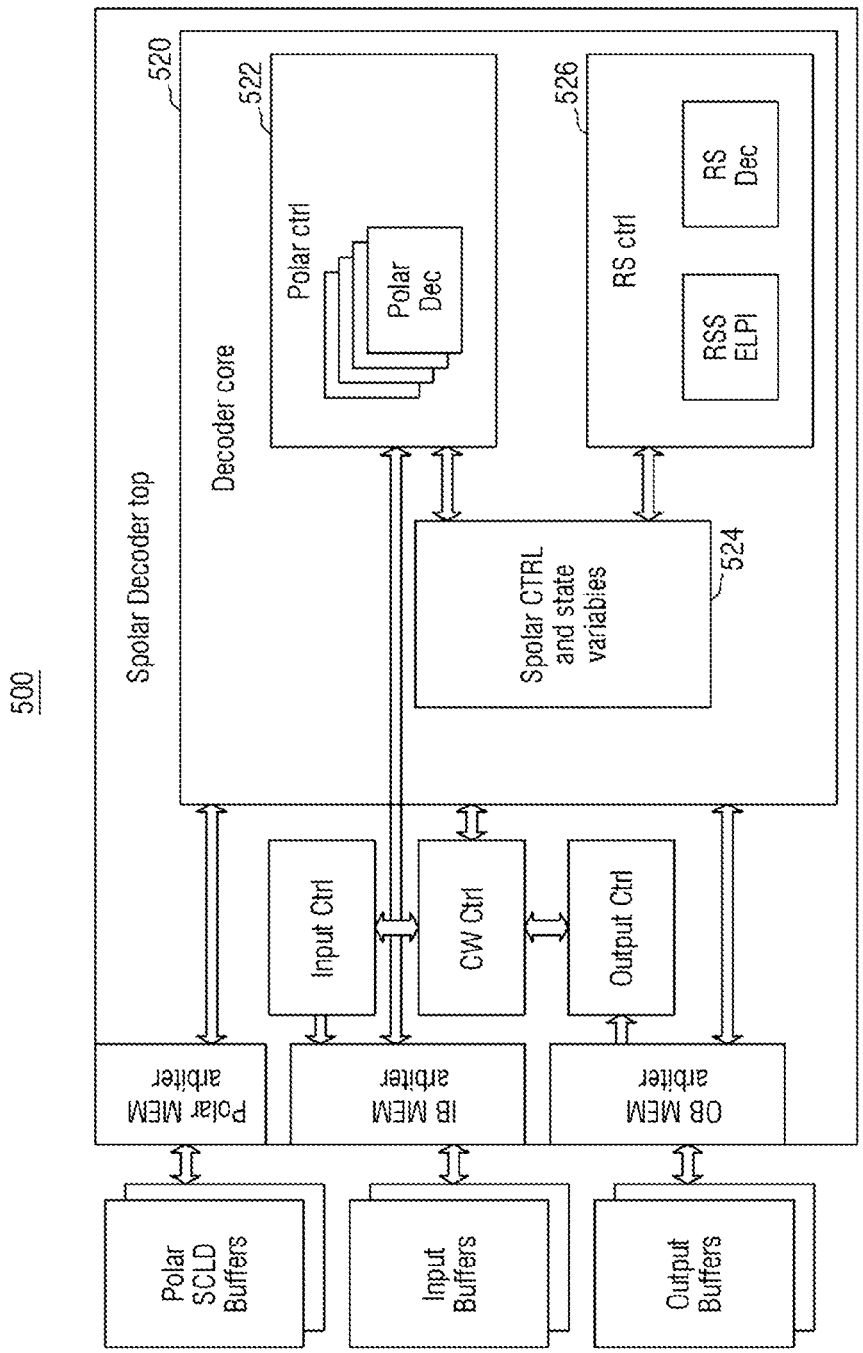
FIG. 5 illustrates a Spolar decoder for low gate-count and high-throughput Reed-Solomon decoding, in accordance with a representative embodiment.

FIG. 5 illustrates a polar decoder for low gate-count and high-throughput Reed-Solomon decoding, in accordance with a representative embodiment.

The processing circuit 500 in FIG. 5 includes a Spolar decoder top 520, with a polar ctrl 522 subcircuit (polar control subcircuit), a Spolar ctrl and state variables 524 subcircuit, and a RS ctrl 526 (Reed-Solomon control subcircuit). The processing circuit 500 in FIG. 5 may be provided for implementation in a polar decoder for initial register transfer level (RTL). As used herein, the term "Spolar" refers to GCC with Polar rows and RS columns, such that Polar is a building block of SPolar and provides the row decoder.

The decode flow for the processing circuit 500 in FIG. 5 is explained next via FIG. 6.

Figure 6:
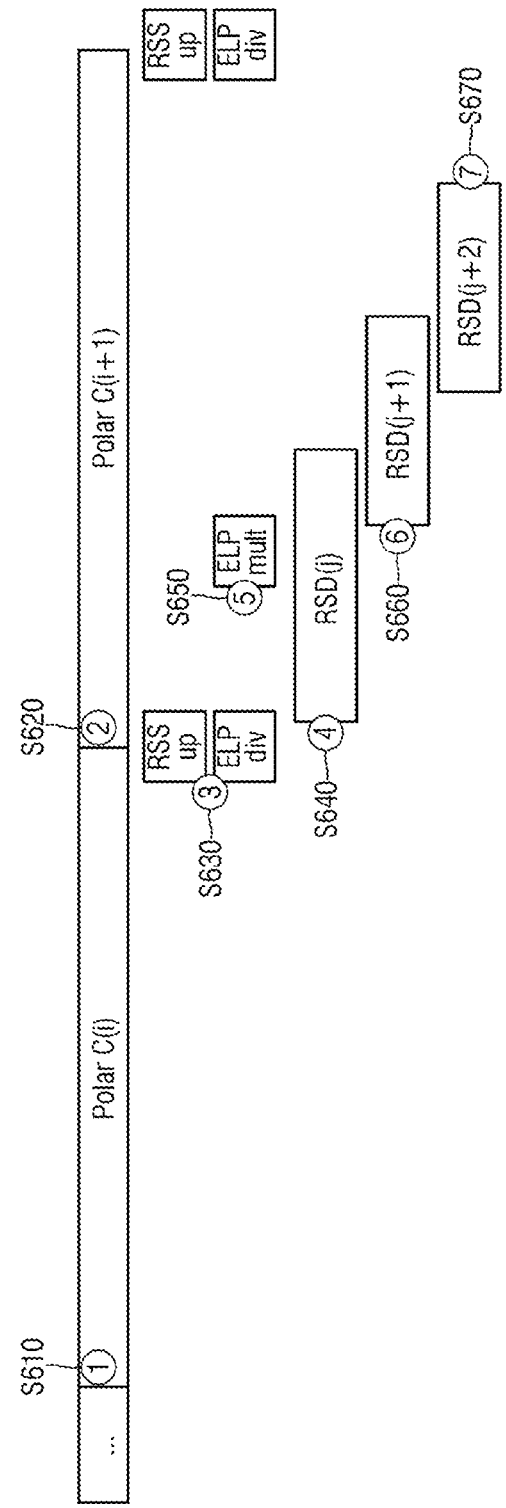
FIG. 6 illustrates a polar decoder flow for low gate-count and high-throughput Reed-Solomon decoding, in accordance with a representative embodiment.

FIG. 6 illustrates a polar decoder flow for low gate-count and high-throughput Reed-Solomon decoding, in accordance with a representative embodiment.

The decode flow may be divided into two separate flows, Polar ctrl and RS ctrl, sharing common control variables and synchronized according to "Polar ctrl" flow. Polar CRTL may involve scanning frames for decode cyclically, until all frames succeed or were decoded in the current decode level and Reed-Solomon decoding is not optional (decode fail). Discrete "stages" maintained for optimizing the code planning (for algorithm performance) and decode TP can be optimized. RS CTRL may involve starting Reed-Solomon decoding as soon as allowed, such as based on a defined safety threshold but without waiting for all Polar frames, referring to both non-decoded frames and failing frames as erasures. As Reed-Solomon decoding succeeds, another "frozen chunk" is made available to work with, and Polar decoders will start using the newly available chunk for the remaining frames.

FIG. 6 shows an example decode flow. As shown, before the decode flow starts, chunks of polar frames are decoded until enough are available to proceed. At step 1 (S610), polar frames are decoded in chunks. At step 2 (S620), once a chunk ends, a new chunk of frames starts with a full pipeline. At step 3 (S630), RSS and ELP are updated according to Polar results. At step 4 (S640), once a first RSS column and ELP (first coefficients) are ready, Reed-Solomon decoding can start. At step 5 (S650), Reed-Solomon decoding results in updating the ELP upon error detection. At step 6 (S660), another Reed-Solomon codeword in the pipeline proceeds to Reed-Solomon decoding. At step 7 (S670), the last Reed-Solomon codeword finishes before processing of the chunk ends.

Figure 7:
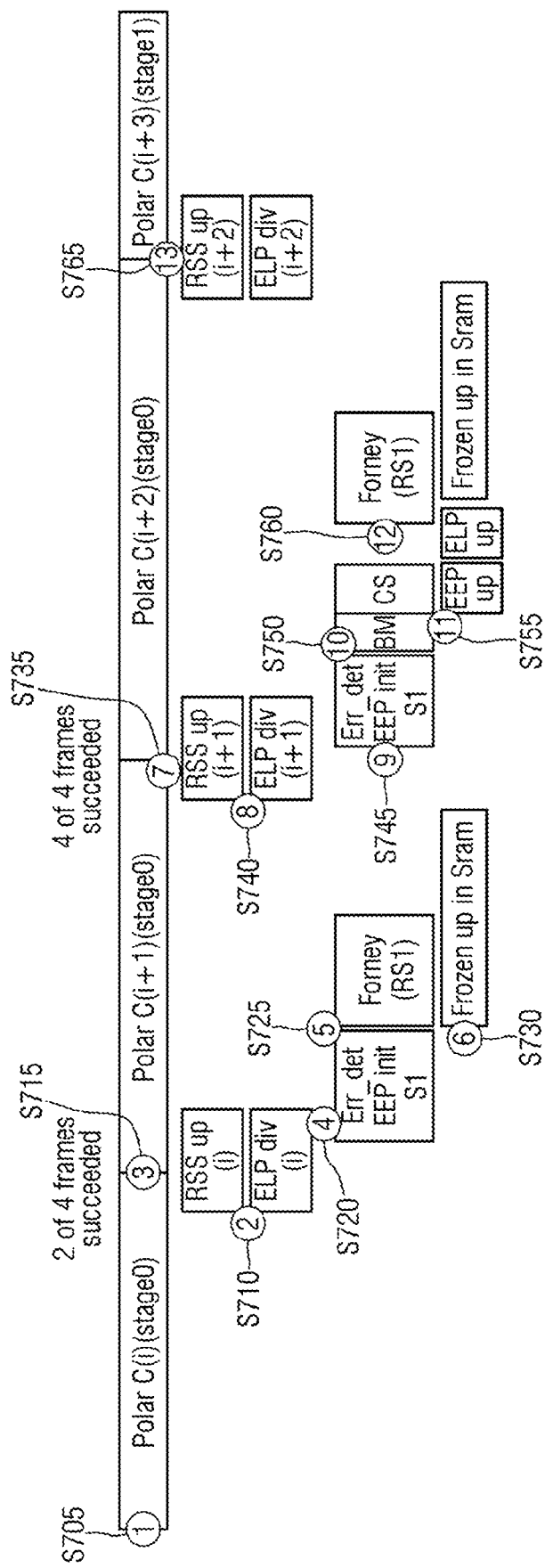
FIG. 7 illustrates a polar decoder flow for low gate-count and high-throughput Reed-Solomon decoding, in accordance with a representative embodiment.

FIG. 7 illustrates a polar decoder flow for low gate-count and high-throughput Reed-Solomon decoding, in accordance with a representative embodiment.

As a guideline for maintaining syndromes, a Reed-Solomon syndrome buffer may contain the syndrome calculated over all frozen symbols of each column. For implementation, all fail or success for all decoded frames may be written to frozen symbols in OB and used to update syndrome columns. For a failing frame, the update will be zeroes. Non decoded frames which are frozen and not initialized may be flagged, and the frozen symbols will be considered zeroes for syndrome calculation. When the polar frame is re-decoded, the contribution of the previous decode to the syndrome is cancelled by adding the "old" frozen symbols to new ones for syndrome calculation. Syndrome maintenance during Polar and Reed-Solomon decoding may occur in different time frames. The Reed-Solomon decoding may require a stable syndrome.

At steps 1 (S705), 3 (S715), 7 (S735) and 23 (765), polar frames are decoded in chunks. Once a chunk ends, a new chunk of frames starts with a full pipeline. At steps 2 (S710) and 8 (S740), RSS and ELP are updated according to Polar results. At steps 4 (S720) and 9 (S745), error detection is performed, and at steps 5 (S725) and 12 (S760) Forney processing is performed. At step 6 (S730) frozen symbols are updated in the frozen memory.

At step 10 (S750), BM processing is performed and a Chien search is performed when errors are detected at S745. At step 11 (S755), an EEP update and an ELP update is performed before the Forney processing at step 12 (S760). The updating of the ELP1 values at S755 and the continuous maintenance of the RSS values and the ELP1 values through the ELP update supports pipelined or parallel decode of multiple RS codewords. Additionally, the conditionality in this process based on error detection allows for reduced processing for instances when errors are not detected as in the processing from S715 to S730. For the usage example in FIG. 7, results of polar updates of all chunk frames may arrive at the end of the chunk as indications of success, failure or MC. The update may take several cycles, depending on the number of columns to update and whether hardware parallelism is used. Syndrome calculations may prioritize the first syndrome column updates, in order to enable first Reed-Solomon decoding to start as soon as possible. Reed-Solomon decoding of Reed-Solomon codeword i waits until the syndrome update for the codeword i is complete. For the corrected codeword i, frozen symbols are updated in the frozen memory, and syndrome for the codeword i will become zeroes, as Reed-Solomon decoding outputs a correct Reed-Solomon codeword. In the event that Polar decoding is successful and frozen values of decoded words do not match, the Polar decode is assumed to be "miss-correct".

Frozen updates may be completed by the Reed-Solomon decoding before the end of the chunk. The update of frozen values by Reed-Solomon decoding as the symbols are received for all frames, including erasures, will be relative to memory content (xor), with the exception that in the first round, all the non-decoded frames will be flagged, the data in frozen memory is not initialized, and is treated as zeroes instead.

Other than for the first round, frozen updates may be completed by Polar by a read-modify-write procedure, so that only the next stage symbols are overrun. In the first round, zeroes are used instead of reading. For syndromes, the next syndrome columns are updated with the delta between existing polar frozen symbol and the new symbol. In the event of failing polar frames, only the upcoming frozen symbols are updated, and the frozen symbols that were already calculated by Reed-Solomon decoding are not changed. For a successful frame, values of the symbols should match. A miss correct detected by Reed-Solomon decoding will not require a special handle.

Figure 8:
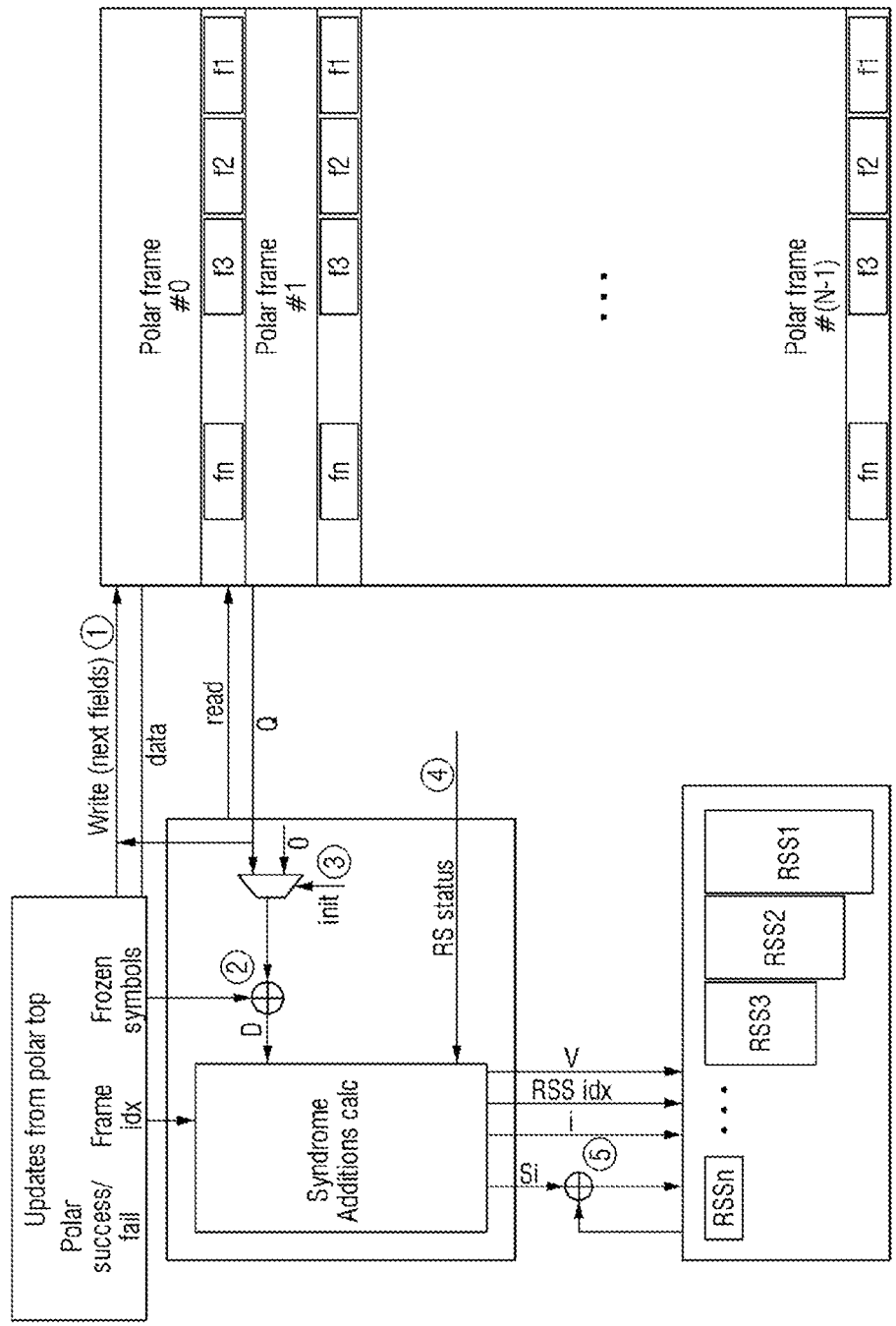
FIG. 8 illustrates polar decoder updates of RSS for low gate-count and high-throughput Reed-Solomon decoding, in accordance with a representative embodiment.

FIG. 8 illustrates polar decoder updates of RSS for low gate-count and high-throughput Reed-Solomon decoding, in accordance with a representative embodiment.

FIG. 8 shows a hardware block polar updates to frozen symbols and syndromes. When a frame decode is done, the relevant frozen line is updated, and the next frozen symbols of a higher stage are updated. For each updated frozen symbol, the syndrome is calculated with both "old" and "new", to cancel the old and add the new. Old non-initialized frozen symbols will be 0. Only syndromes of Reed-Solomon codewords that were not decoded will be updated. The syndrome update interface is parallel, so that a few syndromes are updated per cycle.

For the Reed-Solomon stage and the Polar stages, the number of stages is the maximal number of optional frozen symbols, which is also the number of syndrome columns, noted by "n" in FIG. 8. Reed-Solomon decoding will decode the codewords one-by-one using syndrome columns, starting from 1. Once Reed-Solomon decoding of word i is successful, the syndrome column for i is marked and only higher columns will be updated afterwards.

The polar decode "stage" is defined per chunk, and is up to the latest Reed-Solomon decoded codeword. For example, if Reed-Solomon decoding just decoded codeword RS2, the polar decode stage in the next chunk may be up to 2. The logical block for syndrome additions calculations, i.e., "syndrome additions calc" logic, refers to the "RS_status" information to determine the stage. The polar decode stage is referred to in updates from polar decoders to frozen symbols. When updating polar results to frozen memory (OB), the frozen symbols up to the polar decode stage are taken as inputs, and therefore guaranteed to match frozen symbols in memory. The frozen symbols from the polar decode stage and on may have already been corrected by the Reed-Solomon decoding. If the frame is correct, the values should match. If the frame is not correct, only symbols higher than the Reed-Solomon stage are written. If the frame is correct and the frozen symbols do not match Reed-Solomon decoding results, the decoded frame is assumed to be miss-correct, and is handled as a failing frame since, for example, the probability of the Reed-Solomon decoding being miss correct is much lower.

Accordingly, low gate-count and high-throughput a Reed-Solomon decoder is provided by out-of-order input handling described herein. The teachings herein result in a reduced gate-count, and an ability to process out-of-order input. As a result, a Reed-Solomon decoder may be activated as early as possible, and with results that improve Polar decoder performance. Reed-Solomon decoding may be performed on partial data of decoded frames, with missing date treated as erasures. System status may be maintained for the error location polynomial (ELP) and the Reed-Solomon syndrome (RSS) calculated on the received input, and the inputs may be accumulated to previously received inputs.

The teachings above reference the ability to use improved generalized GRS decoding which is performed efficiently by bypassing processing-intensive steps when appropriate based on detecting the absence of errors early. Bypassing steps may mean that functionality is not performed when the functionality would otherwise be performed, based on a dynamic determination. Additionally, the processing-intensive steps may be performed more efficiently by eliminating consideration of erasures E0 when appropriate, and eliminating the Chien search based on determining in advance that the number of errors E1 will result in a codeword being outside the Singleton bound. To save on the implementation complexity, application of a BM algorithm and a Chien search may be limited to reduce the area and power consumption of these blocks (when implemented in hardware). The simplification may occur primarily in the application of the BM algorithm and the Chien search stage, primarily due to reduction in the maximum ELP degree and the skipping of unnecessary activations of these stages.

As set forth above, instead of applying RSS and ELP0 in the beginning of each RS code and imposing significant calculations with significant latency in GCC decode flow, the teachings herein provide for continuous maintenance of the RSS values and ELP0 values through decoding in a manner that supports pipelined or parallel decode of multiple RS codewords.

Although low gate-count and high-throughput Reed-Solomon decoding has been described with reference to several exemplary embodiments, it is understood that the words that have been used are words of description and illustration, rather than words of limitation. Changes may be made within the purview of the appended claims, as presently stated and as amended, without departing from the scope and spirit of low gate-count and high-throughput Reed-Solomon decoding in its aspects. Although low gate-count and high-throughput Reed-Solomon decoding has been described with reference to particular means, materials and embodiments, low gate-count and high-throughput Reed-Solomon decoding is not intended to be limited to the particulars disclosed; rather low gate-count and high-throughput Reed-Solomon decoding extends to all functionally equivalent structures, methods, and uses such as are within the scope of the appended claims.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

We claim:

1. A method for accessing a memory system, the method comprising:
   receiving, by a controller and from a host device, a request to read data stored in a memory block;
   obtaining, by the controller, encoded data from the memory block via a channel;
   decoding, by the controller, the encoded data using a Reed-Solomon decoder to obtain decoded data, wherein the decoding comprises detecting and correcting one or more errors in the encoded data, and wherein the detecting and correcting comprises:
      receiving partial input data of symbols of a Reed-Solomon codeword;
      updating Reed-Solomon syndromes based on the partial input data;
      updating error location polynomial coefficients based on the partial input data;
      maintaining the Reed-Solomon syndromes and the error location polynomial coefficients in a memory prior to starting activation of Reed-Solomon decoding; and
      inputting the Reed-Solomon syndromes and the error location polynomial coefficients to a first activation of Reed-Solomon decoding, the first activation including calculating an initial error evaluator polynomial as a first error evaluator polynomial, performing error detection on the encoded data based on the first error evaluator polynomial to determine presence and location of the one or more errors in an input Reed-Solomon codeword, and updating the error location polynomial when the one or more errors are found based on the first error evaluator polynomial in the input Reed-Solomon codeword, wherein the error location polynomial coefficients in the memory are updated during each activation of Reed-Solomon decoding when at least one error is identified in the Reed-Solomon codeword; and
   providing, via a direct memory access (DMA) controller, the decoded data to the host device.

2. The method of claim 1, further comprising:
   inputting the Reed-Solomon syndromes and the error location polynomial coefficients to a second activation of Reed-Solomon decoding, the second activation including calculating a second error evaluator polynomial, performing error detection based on the second error evaluator polynomial to determine presence and location of the one or more errors in the input Reed-Solomon codeword, and updating the error location polynomial when the one or more errors are found based on the second error evaluator polynomial in the input Reed-Solomon codeword; and
   inputting the Reed-Solomon syndromes and the error location polynomial coefficients to a third activation of Reed-Solomon decoding, the third activation including calculating a third error evaluator polynomial, performing error detection based on the third error evaluator polynomial to determine presence and location of the one or more errors in the input Reed-Solomon codeword, and updating the error location polynomial when the one or more errors are found based on the third error evaluator polynomial in the input Reed-Solomon codeword.

3. The method of claim 2, wherein the second activation and the third activation of Reed-Solomon decoding are performed without regenerating the Reed-Solomon syndromes or regenerating error location polynomial coefficients.

4. The method of claim 2, further comprising:
   when the one or more errors are detected in the error detection based on the first error evaluator polynomial, updating error location polynomial coefficients in the error location polynomial; and
   when the one or more errors are detected in the error detection based on the second error evaluator polynomial, updating error location polynomial coefficients in the error location polynomial.

5. The method of claim 4, further comprising:
   calculating the first error evaluator polynomial in the first activation of Reed-Solomon decoding based on the error location polynomial; and
   calculating the second error evaluator polynomial in the second activation of Reed-Solomon decoding based on the error location polynomial.

6. The method of claim 1, wherein the first activation of Reed-Solomon decoding is performed for a Reed-Solomon codeword before all symbols of the Reed-Solomon codeword are received.

7. The method of claim 1, wherein the error location polynomial coefficients in the memory are updated by division using a matching monomial when a frame is successfully decoded.

8. A memory system, comprising:
a memory;
a controller comprising a decoding circuit;
a host interface configured to receive, from a host device, a request to read data stored in the memory; and
a memory interface coupled to a channel between the memory and the decoding circuit and configured to receive encoded data from the memory via the channel,
wherein the decoding circuit is configured to decode the encoded data using a Reed-Solomon decoder by detecting and correcting one or more errors in the encoded data to obtain decoded data,
wherein the detecting and correcting comprises:
updating Reed-Solomon syndromes based on partial input data of symbols of a Reed-Solomon codeword;
updating error location polynomial coefficients based on the partial input data;
maintaining the Reed-Solomon syndromes and the error location polynomial coefficients in the memory prior to starting activation of Reed-Solomon decoding; and
inputting the Reed-Solomon syndromes and the error location polynomial coefficients to a first activation of the Reed-Solomon decoding, the first activation including calculating an initial error evaluator polynomial as a first error evaluator polynomial, performing error detection on the encoded data based on the first error evaluator polynomial to determine presence and location of the one or more errors in an input Reed-Solomon codeword, and updating the error location polynomial when the one or more errors are found based on the first error evaluator polynomial in the input Reed-Solomon codeword, and
wherein the error location polynomial coefficients in the memory are updated during each activation of the Reed-Solomon decoding when at least one error is identified in the Reed-Solomon codeword, and
wherein the controller is configured to provide, via a direct memory access (DMA) controller, the decoded data to the host device.

9. The memory system of claim 8, wherein the decoding circuit is further configured to:
input the Reed-Solomon syndromes and the error location polynomial coefficients to a second activation of Reed-Solomon decoding, the second activation including calculating a second error evaluator polynomial, performing error detection based on the second error evaluator polynomial to determine presence and location of the one or more errors in the input Reed-Solomon codeword, and updating the error location polynomial when the one or more errors are found based on the second error evaluator polynomial in the input Reed-Solomon codeword; and
input the Reed-Solomon syndromes and the error location polynomial coefficients to a third activation of Reed-Solomon decoding, the third activation including calculating a third error evaluator polynomial, performing error detection based on the third error evaluator polynomial to determine presence and location of the one or more errors in the input Reed-Solomon codeword, and updating the error location polynomial when the one or more errors are found based on the third error evaluator polynomial in the input Reed-Solomon codeword.

10. The memory system of claim 9, wherein the second activation and the third activation of Reed-Solomon decoding are performed without regenerating the Reed-Solomon syndromes or regenerating error location polynomial coefficients.

11. The memory system of claim 9, wherein the decoding circuit is further configured to:
when the one or more errors are detected in the error detection based on the first error evaluator polynomial, update error location polynomial coefficients in the error location polynomial; and
when the one or more errors are detected in the error detection based on the second error evaluator polynomial, update error location polynomial coefficients in the error location polynomial.

12. The memory system of claim 11, wherein the decoding circuit is further configured to:
calculate the first error evaluator polynomial in the first activation of Reed-Solomon decoding based on the error location polynomial; and
calculate the second error evaluator polynomial in the second activation of Reed-Solomon decoding based on the error location polynomial.

13. The memory system of claim 8, wherein the first activation of Reed-Solomon decoding is performed for a Reed-Solomon codeword before all symbols of the Reed-Solomon codeword are received.

14. The memory system of claim 8, wherein the error location polynomial coefficients in the memory are updated by division using a matching monomial when a frame is successfully decoded.

15. A system for Reed-Solomon decoding, the system comprising:
an interface coupled to a channel between a memory and a processing circuit;
wherein the processing circuit is configured to implement a process for decoding a Reed-Solomon codeword starting with a partial input data of symbols of the Reed-Solomon codeword,
wherein the processing circuit is configured to:
obtain, via the channel, encoded data stored in the memory; and
decode the encoded data using a Reed-Solomon decoder by detecting and correcting one or more errors in the encoded data to obtain decoded data, and
wherein the detecting and correcting comprises:
updating Reed-Solomon syndromes based on the partial input data of symbols of the Reed-Solomon codeword received via the Interface;
updating error location polynomial coefficients based on the partial input data;
maintaining the Reed-Solomon syndromes and the error location polynomial coefficients in a memory prior to starting activation of Reed-Solomon decoding;
inputting the Reed-Solomon syndromes and the error location polynomial coefficients to a first activation of the Reed-Solomon decoding, the first activation including calculating an initial error evaluator polynomial as a first error evaluator polynomial, performing error detection on the encoded data based on the first error evaluator polynomial to determine presence and location of the one or more errors in an input Reed-Solomon codeword, and updating the error location polynomial when the one or more errors are found based on the first error evaluator polynomial in the input Reed-Solomon codeword, wherein the error location polynomial coefficients in the memory are updated during each activation of the Reed-Solomon decoding when at least one error is identified in the Reed-Solomon codeword, and providing, via a direct memory access (DMA) controller, the decoded data to a host device.

16. The system of claim 15, wherein the processing circuit is further configured to:

input the Reed-Solomon syndromes and the error location polynomial coefficients to a second activation of Reed-Solomon decoding, the second activation including calculating a second error evaluator polynomial, performing error detection based on the second error evaluator polynomial to determine presence and location of the one or more errors in the input Reed-Solomon codeword, and updating the error location polynomial when the one or more errors are found based on the second error evaluator polynomial in the input Reed-Solomon codeword; and input the Reed-Solomon syndromes and the error location polynomial coefficients to a third activation of Reed-Solomon decoding, the third activation including calculating a third error evaluator polynomial, performing error detection based on the third error evaluator polynomial to determine presence and location of the one or more errors in the input Reed-Solomon codeword, and updating the error location polynomial when the one or more errors are found based on the third error evaluator polynomial in the input Reed-Solomon codeword.

17. The system of claim 16, wherein the second activation and the third activation of Reed-Solomon decoding are performed without regenerating the Reed-Solomon syndromes or regenerating error location polynomial coefficients.

18. The system of claim 16, wherein the processing circuit is further configured to:

when the one or more errors are detected in the error detection based on the first error evaluator polynomial, update the error location polynomial coefficients in the error location polynomial; and when the one or more errors are detected in the error detection based on the second error evaluator polynomial, update the error location polynomial coefficients in the error location polynomial.

19. The system of claim 18, wherein the processing circuit is further configured to:

calculate the first error evaluator polynomial in the first activation of Reed-Solomon decoding based on the error location polynomial; and calculate the second error evaluator polynomial in the second activation of Reed-Solomon decoding based on the error location polynomial.

20. The system of claim 16, wherein the first activation of Reed-Solomon decoding is performed for a Reed-Solomon codeword before all symbols of the Reed-Solomon codeword are received.

21. The system of claim 16, wherein the error location polynomial coefficients in the memory are updated by division using a matching monomial when a frame is successfully decoded.

* * * * *